US012777939B2

(12) United States Patent
Choi

(10) Patent No.: US 12,777,939 B2
(45) Date of Patent: Oct. 27, 2026

(54) SEMICONDUCTOR DEVICE AND MANUFACTURING METHOD OF SEMICONDUCTOR DEVICE

(71) Applicant: SK hynix Inc., Gyeonggi-do (KR)

(72) Inventor: Won Geun Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 263 days.

(21) Appl. No.: 18/646,765

(22) Filed: Apr. 26, 2024

(65) Prior Publication Data

US 2025/0239538 A1 Jul. 24, 2025

(30) Foreign Application Priority Data

Jan. 22, 2024 (KR) ........................ 10-2024-0009714

(51) Int. Cl.
*H10W 42/00* (2026.01)
*H10B 41/27* (2023.01)
*H10B 43/27* (2023.01)

(52) U.S. Cl.
CPC .......... *H10W 42/121* (2026.01); *H10B 41/27* (2023.02); *H10B 43/27* (2023.02)

(58) Field of Classification Search
CPC ...... H10W 42/121; H10B 41/40; H10B 43/40
See application file for complete search history.

(56) References Cited

U.S. PATENT DOCUMENTS

| | | | | |
|---|---|---|---|---|
| 2019/0088672 | A1* | 3/2019 | Tomimatsu | G11C 16/0483 |
| 2022/0005824 | A1* | 1/2022 | Tanaka | H10B 41/10 |
| 2022/0157849 | A1* | 5/2022 | Lee | H10B 41/10 |
| 2022/0384479 | A1* | 12/2022 | Song | G11C 5/025 |
| 2024/0349503 | A1* | 10/2024 | Choi | H10B 43/10 |
| 2024/0414918 | A1* | 12/2024 | Choi | H10B 43/27 |

FOREIGN PATENT DOCUMENTS

KR 10-2021-0002138 A 1/2021

* cited by examiner

*Primary Examiner* — Steven M Page
(74) *Attorney, Agent, or Firm* — IP&T GROUP LLP

(57) ABSTRACT

A semiconductor device may include a first gate structure including first conductive layer; a second gate structure disposed over or on the first gate structure and including second conductive layers; first supports, each support including a first portion extending through the first gate structure and having a first width and a second portion extending through the second gate structure and having a second width, the first width being greater than the second width; second supports extending through the first gate structure and the second gate structure and having a third width; a first contact structure extending through the second gate structure, the first contact structure being electrically connected to at least one of the second conductive layers; and a second contact structure extending through the second gate structure and the first gate structure, the second contact structure being electrically connected to at least one of the first conductive layers.

9 Claims, 15 Drawing Sheets

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2024-0009714 filed on Jan. 22, 2024, which is incorporated herein by reference in its entirety.

BACKGROUND

1. Technical Field

Embodiments of the present disclosure relate generally to an electronic device and a manufacturing method of the electronic device, and more particularly, to a semiconductor device and a manufacturing method of the semiconductor device.

2. Related Art

The degree of integration of a semiconductor device is mainly determined by an area occupied by a unit memory cell. Recently, as improvements in the degree of integration of a semiconductor device having a single layer array of memory cells are reaching a limit, three-dimensional semiconductor devices have been proposed which stack memory cells in a plurality of layers over a substrate. Furthermore, improve the operational reliability of such semiconductor devices, various structures and manufacturing methods have been proposed. However, further improvements are needed.

SUMMARY

In an embodiment of the present disclosure, a semiconductor device may include a first gate structure including first insulating layers and first conductive layers alternately stacked; a second gate structure disposed over or on the first gate structure and including second insulating layers and second conductive layers alternately stacked; first supports, each first support including a first portion extending through the first gate structure and having a first width and a second portion extending through the second gate structure and having a second width, the first width being greater than the second width; second supports extending through the first gate structure and the second gate structure and having a third width; a first contact structure extending through the second gate structure between the first supports, the first contact structure being electrically connected to at least one of the second conductive layers; and a second contact structure extending through the second gate structure and the first gate structure between the second supports, the second contact structure being electrically connected to at least one of the first conductive layers.

In an embodiment of the present disclosure, a manufacturing method of a semiconductor device may include forming a first stack; forming first support holes extending through the first stack and having a first width; forming second support holes extending through the first stack and having a second width smaller than the first width; forming a second stack on the first stack; forming third support holes through the second stack, the third support holes being connected to the first support holes and having a third width smaller than the first width; forming fourth support holes through the second stack, the fourth support holes being connected to the second support holes and having a fourth width smaller than the first width; forming a first contact structure extending through the second stack between the third support holes; and forming a second contact structure extending through the second stack and the first stack between the fourth support holes and between the second support holes.

DETAILED DESCRIPTION

Various embodiments of the present disclosure are directed to a three dimensional semiconductor device (hereinafter referred to simply as a semiconductor device) having an improved stable structure and improved characteristics and a manufacturing method of the semiconductor device.

According to the present technology, it is possible to provide a semiconductor device having a stable structure and improved reliability.

Hereafter, various example embodiments in accordance with the present disclosure will be described with reference to the accompanying drawings.

Figure 1:
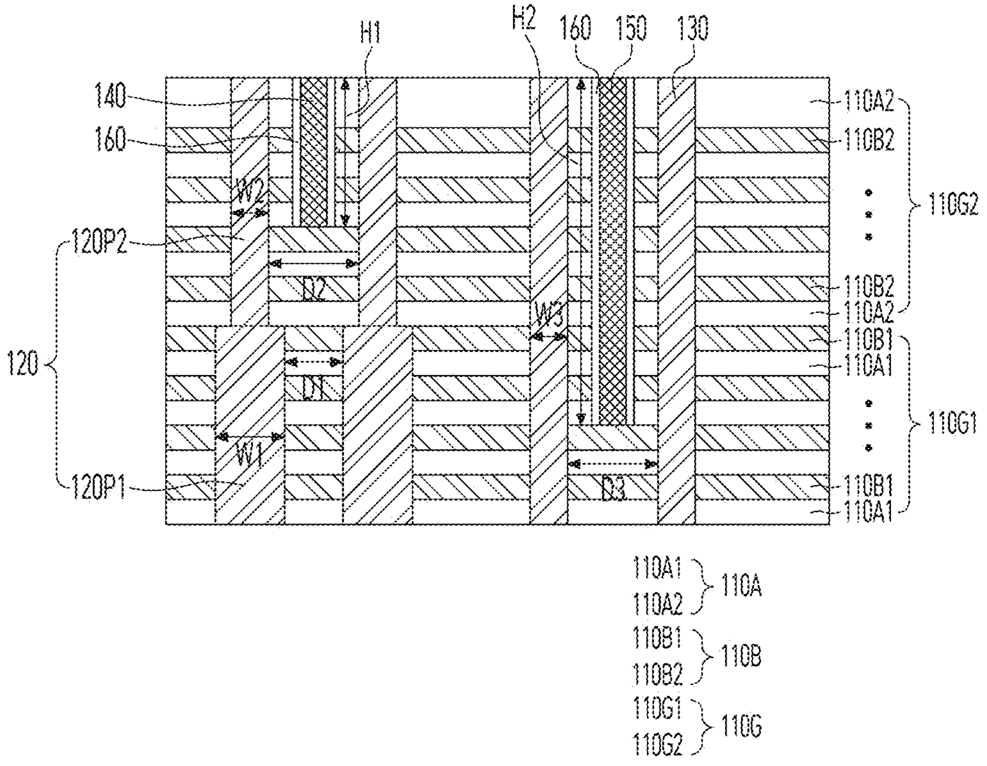
FIG. 1 is a diagram illustrating a semiconductor device in accordance with an embodiment of the present disclosure.

FIG. 1 is a diagram illustrating a semiconductor device in accordance with an embodiment of the present disclosure.

Referring to FIG. 1, the semiconductor device may include at least one of a gate structure 110G, first supports 120, second supports 130, a first contact structure 140, a second contact structure 150, and insulating spacers 160.

The gate structure 110G may include insulating layers 110A and conductive layers 110B that are alternately stacked. The gate structure 110G may include a first gate structure 110G1 and a second gate structure 110G2 disposed over or on the first gate structure 110G1. The first gate structure 110G1 may include first insulating layers 110A1 and first conductive layers 110B1 that are alternately stacked. The second gate structure 110G2 may include second insulating layers 110A2 and second conductive layers 110B2 that are alternately stacked. The insulating layers 110A may each include an insulating material such as an oxide and the conductive layers 110B may each include a conducting material such as tungsten, polysilicon, or molybdenum.

The first supports 120 may extend through the gate structure 110G. The first support 120 may include a first portion 120P1 and a second portion 120P2. The first portion 120P1 and the second portion 120P2 may constitute the whole of the first support 120 as shown in the embodiment of FIG. 1 The first portion 120P1 may extend through the first gate structure 110G1, and the second portion 120P2 may extend through the second gate structure 110G2. The first portion 120P1 and the second portion 120P2 may have different widths. For example, the first portion 120P1 may have a first width W1, the second portion 120P2 may have a second width W2, and the first width W1 may be greater than the second width W2. The first supports 120 may have a greater width at lower portions thereof than at upper portions thereof.

The first portions 120P1 of the first supports 120 may be spaced apart from each other by a first distance D1, and the second portions 120P2 of the first supports 120 may be spaced apart from each other by a second distance D2. In the illustrated embodiment, for example, the first distance D1 may be smaller than the second distance D2.

Because the first width W1 of the first portions 120P1 may be greater than the second width W2 of the second portions 120P2, the first distance D1 between the first portions 120P1 may be relatively smaller than the second distance D2 between the second portions 120P2. The first supports 120 may each include an insulating material such as an oxide.

The first supports 120 may support the gate structure 110G, and may prevent or reduce bending of the gate structure 110G in a manufacturing process of the semiconductor device. A supporting force of the first supports 120 may be related to a distance between the first supports 120. As the distance between the first supports 120 decreases, the supporting force of the first supports 120 may increase, and as the distance between the first supports 120 increases, the supporting force of the first supports 120 may decrease. Accordingly, it is possible to increase the supporting force of the first supports 120 by arranging the first supports 120 at narrower intervals.

The second supports 130 may extend through the gate structure 110G. For example, the second supports 130 may extend through the first gate structure 110G1 and the second gate structure 110G2. The second supports 130 may have a uniform width along their entire length. The second supports 130 may have a third width W3. In the illustrated embodiment, for example, the third width W3 may be substantially the same as the second width W2. Accordingly, the third width W3 may be smaller than the first width W1. The second supports 130 may be spaced apart from each other by a third distance D3. In the illustrated embodiment, for example, the third distance D3 may be substantially the same as the second distance D2. Accordingly, the third distance D3 may be greater than the first distance D1. The second supports 130 may each include an insulating material such as an oxide. The second supports 130 may support the gate structure 110G, and may prevent or reduce bending of the gate structure 110G.

At least one of the first contact structure 140 and the second contact structure 150 may extend through the gate structure 110G. At least one of the first contact structure 140 and the second contact structure 150 may be electrically connected to at least one of the conductive layers 110B of the gate structure 110G. For example, the first contact structure 140 may extend through the second gate structure 110G2 between the first supports 120, and may be electrically connected to at least one of the second conductive layers 110B2. The second contact structure 150 may extend through the first gate structure 110G1 and the second gate structure 110G2 between the second supports 130, and may be electrically connected to at least one of the first conductive layers 110B1. The first contact structure 140 and the second contact structure 150 may have different heights. For example, the first contact structure 140 may have a first height H1, and the second contact structure 150 may have a second height H2 greater than the first height H1. The contact structures 140 and 150 may each include a conductive material such as tungsten.

When the first contact structure 140 is located between the first supports 120, there is a limitation in reducing the distance between the first supports 120. At a level at which the first supports 120 and the first contact structure 140 overlap with each other, the gate structure 110G may be supported by the first supports 120 and the first contact structure 140. However, at a level at which the first supports 120 and the first contact structure 140 do not overlap with each other, the distance between the first supports 120 is great, and thus, the gate structure 110G may be bent. Accordingly, in order to overcome a difference in supporting force depending on the level, the width of the first supports 120 may be adjusted according to the level. The first supports 120 may be designed to have a relatively small width at the second portion 120P2 that overlaps with the first contact structure 140 and have a relatively great width at the first portion 120P1 that does not overlap with the first contact structure 140. Through this, a space where the first contact structure 140 is to be located between the first supports 120 may be secured, and the supporting force may be increased.

The insulating spacers 160 may surround the sidewalls of the first and second contact structures 140 and 150. The insulating spacers 160 may prevent the remaining conductive layers 110B excluding the conductive layers 110B1 and 110B2 to which the contact structures 140 and 150 are connected from being electrically connected to the contact structures 140 and 150. The insulating spacers 160 may each include an insulating material such as an oxide.

According to the structure described above, the first portions 120P1 of the first supports 120 may have the first width W1 that is relatively great, and may be spaced apart from each other by the first distance D1 that is relatively small. In addition, the second portion 120P2 of the first supports 120 may have the second width W2 that is relatively small, and may be spaced apart from each other by the second distance D2 that is relatively great. Accordingly, the first supports 120 may secure the space where the first contact structure 140 is to be located, and may prevent or reduce the bending of the gate structure 110G.

Figure 2A:
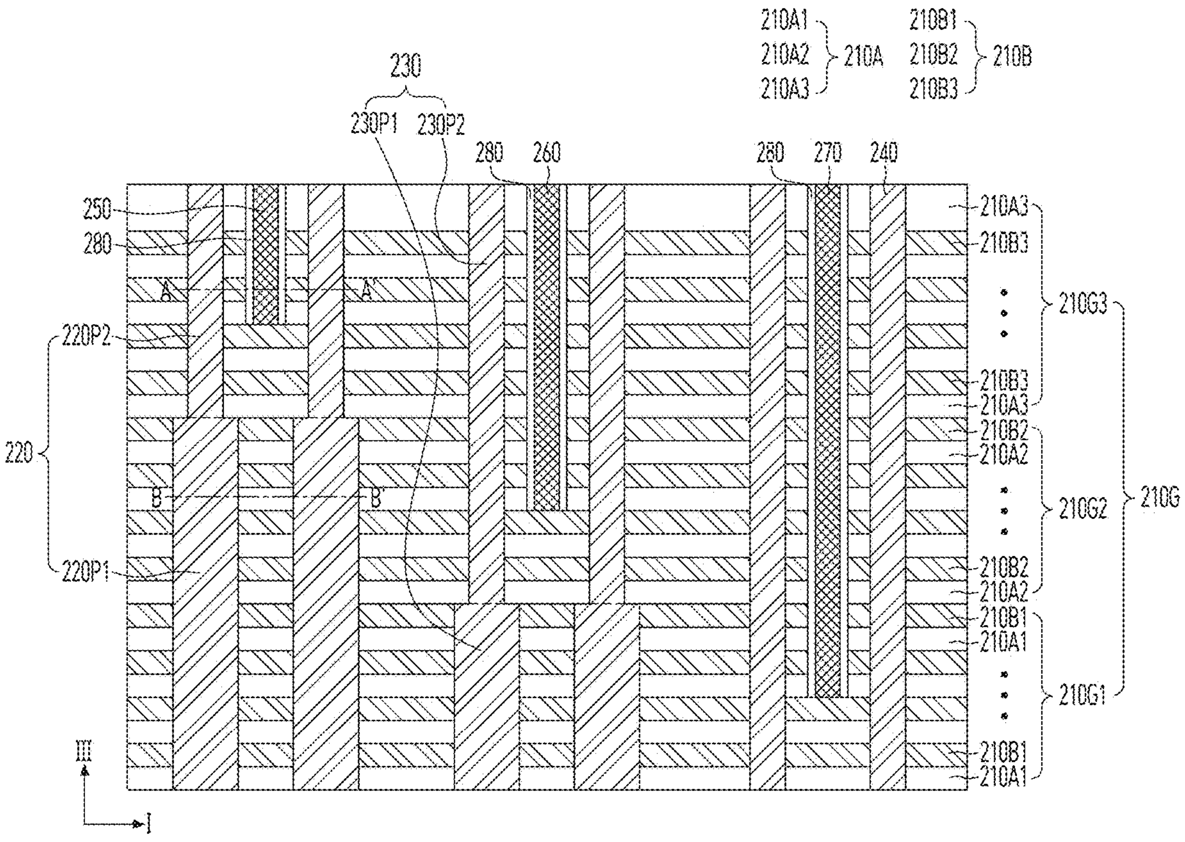
FIGS. 2A to 2C are diagrams illustrating a semiconductor device in accordance with an embodiment of the present disclosure.
Figure 2B:
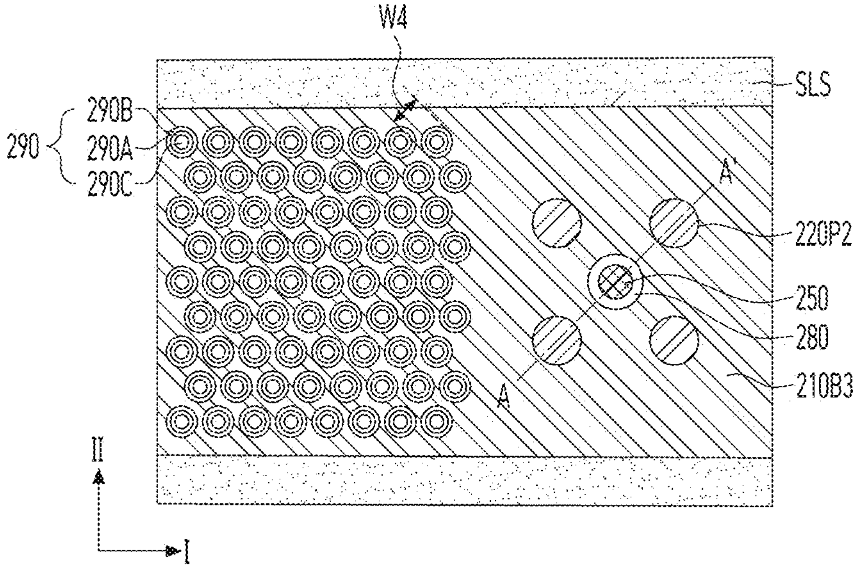
Figure 2C:
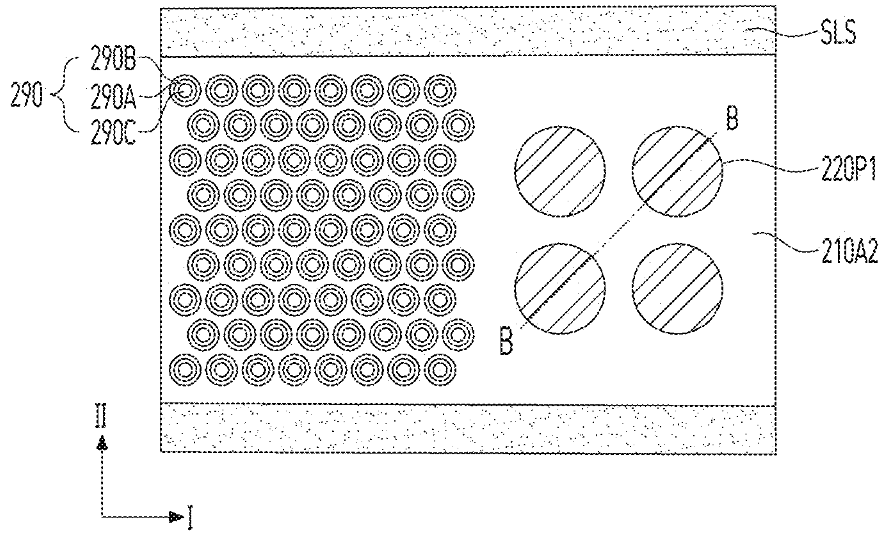

FIGS. 2A to 2C are diagrams illustrating a semiconductor device in accordance with an embodiment of the present disclosure. FIG. 2A is a cross-sectional view, FIG. 2B is a plan view including a plan view of first supports 220 taken along line A-A' of FIG. 2A, and FIG. 2C is a plan view including a plan view of the first supports 220 taken along line B-B' of FIG. 2A. Hereinafter, content overlapping with the previously described content may be omitted.

Referring to FIGS. 2A to 2C, the semiconductor device may include at least one of a gate structure 210G, first supports 220, second supports 230, third supports 240, a first contact structure 250, a second contact structure 260, a third contact structure 270, insulating spacers 280, channel structures 290, and slit structures SLS.

The gate structure 210G may include insulating layers 210A and conductive layers 210B that are alternately stacked. The gate structure 210G may include a first gate structure 210G1, a second gate structure 210G2 disposed over or on the first gate structure 210G1, and a third gate structure 210G3 disposed over the second gate structure 210G2.

The first gate structure 210G1 may include first insulating layers 210A1 and first conductive layers 210B1 that are alternately stacked. The second gate structure 210G2 may include second insulating layers 210A2 and second conductive layers 210B2 that are alternately stacked. The third gate structure 210G3 may include third insulating layers 210A3 and third conductive layers 210B3 that are alternately stacked.

The first supports 220 may extend through the gate structure 210G. The first support 220 may include a first portion 220P1 extending through the first gate structure 210G1 and the second gate structure 210G2 and a second portion 220P2 extending through the third gate structure 210G3. The first portion 220P1 and the second portion 220P2 may have different widths. For example, the first portion 220P1 may have a greater width than the second portion 220P2. The first supports 220 may have a greater width at lower portions thereof than at upper portions thereof.

The second supports 230 may extend through the gate structure 210G. The second support 230 may include a first portion 230P1 extending through the first gate structure 210G1 and a second portion 230P2 extending through the second and third gate structures 210G2 and 210G3. The first portion 230P1 and the second portion 230P2 may have different widths. For example, the first portion 230P1 may have a greater width than the second portion 230P2. The first portion 230P1 of the second support 230 may have substantially the same width as the first portion 220P1 of the first support 220. The second portion 230P2 of the second support 230 may have substantially the same width as the second portion 220P2 of the first support 220.

The third supports 240 may extend through the gate structure 210G. For example, the third supports 240 may extend through the first, second, and third gate structures 210G1, 210G2, and 210G3. The third supports 240 may have a uniform width along their entire length. The third supports 240 may have substantially the same width as the second portion 220P2 of the first support 220 and the second portion 230P2 of the second support 230.

At least one of the contact structures 250, 260, and 270 may extend through the gate structure 210G and be electrically connected to at least one of the conductive layers 210B of the gate structure 210G. The first contact structure 250 may extend at least partially through the third gate structure 210G3 between the first supports 220 and may be electrically connected to at least one of the third conductive layers 210B3. Insulating spacers 280 may surround the sidewalls of the first contact structure 250 to prevent electrical contact with the remaining third conductive layers 210B3. The second contact structure 260 may extend through the third gate structure 210G3 and partially through the second gate structure 210G2. The second contact structure 260 may extend through the third gate structure 210G3 and partially through the second gate structure 210G2 and may be positioned between the second supports 230 and be electrically connected to at least one of the second conductive layers 210B2. The third contact structure 270 may extend through the second gate structure 210G2, and the third gate structure 210G3, and partially through the first gate structure 210G1. The third contact structure 270 may be positioned between the third supports 240 and may be electrically connected to at least one of the first conductive layers 210B1.

For reference, the contact structures 250, 260, and 270 connected to one conductive layer of the conductive layers 210B1, 210B2, and 210B3 of the gate structures 210G1, 210G2, and 210G3 have been illustrated in FIG. 2A, but there may be contact structures of which the number corresponds to the number of conductive layers 210B of the gate structure 210G. The contact structures may extend through the gate structure 210G between the supports and be connected to the conductive layers 210B, respectively. In such a case, the contact structures connected to the first conductive layers 210B1 of the first gate structure 210G1 may be located between supports having a shape of the third supports 240, the contact structures connected to the second conductive layers 210B2 of the second gate structure 210G2 may be located between supports having a shape of the second supports 230, and the contact structures connected to the third conductive layers 210B3 of the third gate structure 210G3 may be located between supports having a shape of the first supports 220.

The supports 220, 230, and 240 may support the gate structure 210G, and may prevent or reduce bending of the gate structure 210G. The supports 220, 230, and 240 may secure spaces where the contact structures 250, 260, and 270 are to be located between the supports 220, 230, and 240, respectively, and may increase the supporting force for these structures.

The insulating spacers 280 may surround sidewalls of the contact structures 250, 260 and 270. The insulating spacers 280 may prevent the remaining conductive layers 210B excluding the conductive layers 210B1, 210B2, and 210B3 to which the contact structures 250, 260 and 270 are connected from being electrically connected to the contact structures 250, 260 and 270. The insulating spacers 280 may each include an insulating material such as an oxide.

The channel structures 290 may extend through the gate structure 210G. The channel structures 290 may be arranged in a first direction I and a second direction II. For example, the channel structures 290 may be arranged in a zigzag shape. The channel structures 290 may have a fourth width W4. Referring to FIG. 1 again, the fourth width W4 may be smaller than the first width W1 of the first supports 120 and/or the third width W3 of the second supports 130. Each of the channel structures 290 may include at least one of a channel layer 290A, a memory layer 290B surrounding the channel layer 290A, and an insulating core 290C located in the channel layer 290A.

The slit structures SLS may extend through the gate structure 210G. The slit structures SLS may extend along their long dimension in the first direction I and may have a small width in the second direction. The slit structures SLS may have the shape of parallel lines spaced apart from each other in the second direction II. The slit structures SLS may each include at least one of a conductive material, an insulating material, and a semiconductor material.

According to the structure described above, the supports 220 and 230 may have a greater width at lower portions thereof than at upper portions thereof. A distance between the upper portions of the supports 220 and 230 may be greater than a distance between the lower portions of the supports 220 and 230, and the distance between the lower portions of the supports 220 and 230 may be small. Accordingly, the supports 220 and 230 may support the gate structure 210G while securing the spaces where the contact structures 250 and 260 are to be located.

FIGS. 3A to 3D are diagrams illustrating a manufacturing method of a semiconductor device in accordance with an embodiment of the present disclosure. Hereinafter, content overlapping with the previously described content may be omitted.

Figure 3A:
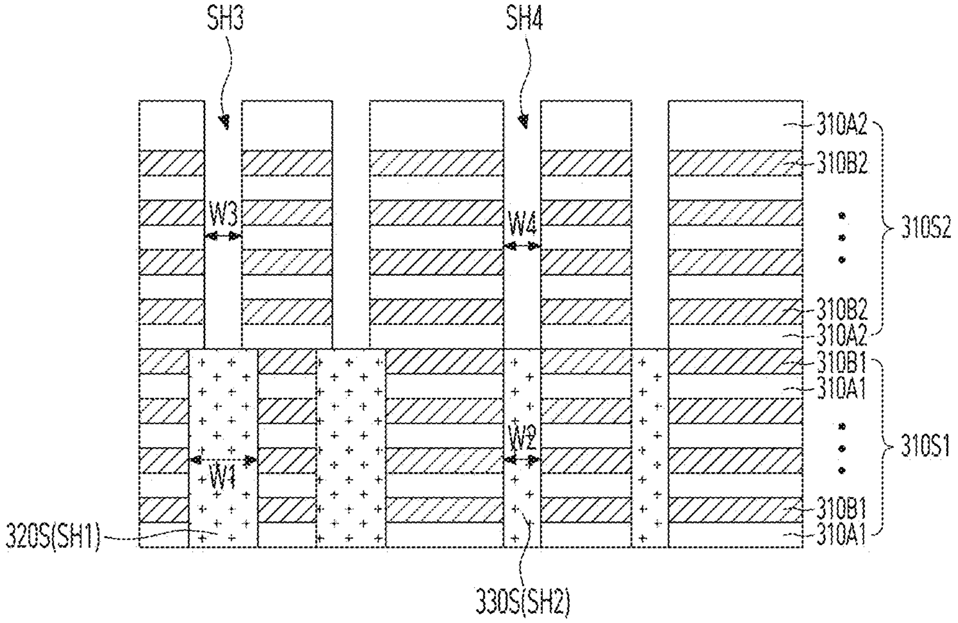
FIGS. 3A to 3D are diagrams illustrating a manufacturing method of a semiconductor device in accordance with an embodiment of the present disclosure.

Referring to FIG. 3A, a first stack 310S1 may be formed by alternately stacking first material layers 310A1 and second material layers 310B1. The first material layers 310A1 may each include an insulating material such as an oxide. The second material layers 310B1 may each include a sacrificial material such as a nitride. Alternatively, the second material layers 310B1 may each include a conductive material such as tungsten.

Subsequently, first support holes SH1 extending through the first stack 310S1 may be formed. The first support holes SH1 may each have a first width W1. Second support holes SH2 extending through the first stack 310S1 may also have a second width W2 that is in the illustrated embodiment, for example, smaller than the first width W1. In an embodiment, when the first support holes SH1 are formed, the second support holes SH2 may be formed. In such a case, the support holes SH1 and SH2 having different widths may be formed simultaneously or may be formed by forming holes having the same size and then selectively expanding some of the holes.

Subsequently, first support sacrificial layers 320S may be formed in the first support holes SH1. Second support sacrificial layers 330S may be formed in the second support holes SH2. When the first support sacrificial layers 320S are formed, the second support sacrificial layers 330S may be formed. In the illustrated embodiment, for example, the first and second support sacrificial layers 320S and 330S may each include a material having a high etching selectivity with respect to the first material layers and the second material layers. For example, the support sacrificial layers 320S and 330S may each include a sacrificial material such as carbon, tungsten, or metal nitride.

Subsequently, a second stack 310S2 may be formed over or on the first stack 310S1. In the illustrated embodiment, the second stack 310S2 is formed on the first stack 310S1. In the illustrated embodiment, for example, the second stack 310S2 may include third material layers 310A2 and fourth material layers 310B2 that are alternately stacked. The third material layers 310A2 may each include an insulating material such as an oxide. The fourth material layers 310B2 may each include a sacrificial material such as a nitride. Alternatively, the fourth material layers 310B2 may each include a conductive material such as tungsten.

Subsequently, third support holes SH3 connected to the first support holes SH1 may be formed through the second stack 310S2. The first support sacrificial layers 320S may be exposed through the third support holes SH3. The third support holes SH3 may have a third width W3. In the illustrated embodiment, for example, the third width W3 may be smaller than the first width W1. Accordingly, the first support holes SH1 have the first width W1 that is relatively great, and thus, a landing margin may be secured in a process of forming the third support holes SH3 connected to the first support holes SH1.

Fourth support holes SH4 connected to the second support holes SH2 may be formed through the second stack 310S2. When the third support holes SH3 are formed, the fourth support holes SH4 may be formed. The second support sacrificial layers 330S may be exposed through the fourth support holes SH4. The fourth support holes SH4 may have a fourth width W4. In the illustrated embodiment, for example, the fourth width W4 may be substantially the same as the third width W3. The third width W3 or the fourth width W4 may be substantially the same as the second width W2. The third width W3 or the fourth width W4 may be smaller than the first width W1.

Figure 3B:
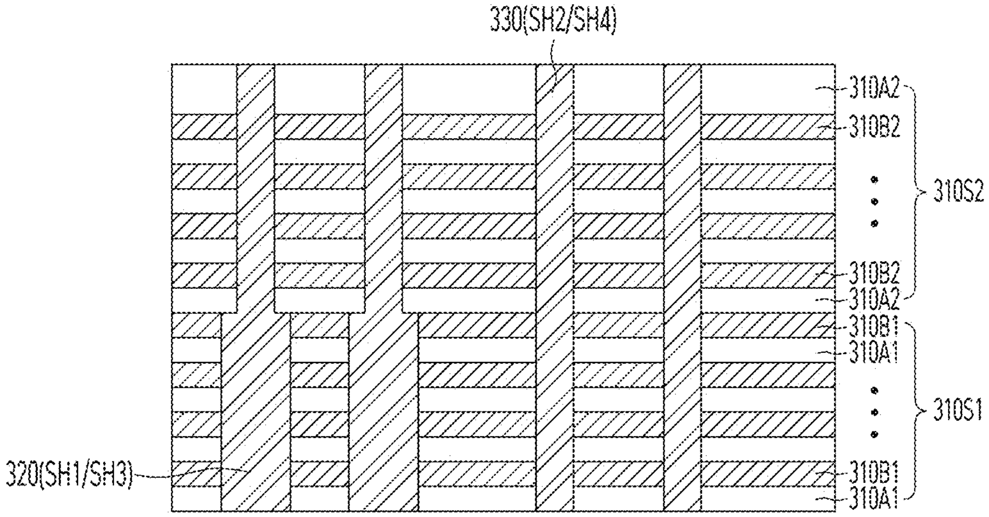

Referring to FIG. 3B, first supports 320 may be formed. First, the first support sacrificial layers 320S exposed through the third support holes SH3 may be removed. Subsequently, the first supports 320 may be formed in the first support holes SH1 and the third support holes SH3. The first supports 320 may have a greater width at lower portions thereof than at upper portions thereof. The first supports 320 may each include an insulating material such as an oxide.

Second supports 330 may be formed. First, the second support sacrificial layers 330S exposed through the fourth support holes SH4 may be removed. Subsequently, the second supports 330 may be formed in the second support holes SH2 and the fourth support holes SH4. The second supports 330 may have a uniform width at upper portions and lower portions thereof. The second supports 330 may each include an insulating material such as an oxide.

Figure 3C:
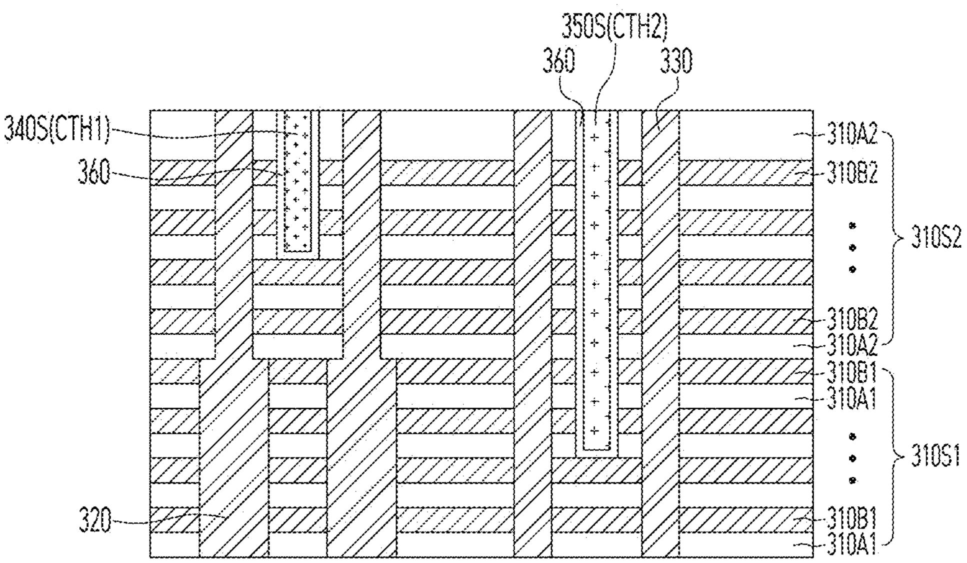

Referring to FIG. 3C, a first contact hole CTH1 extending through the second stack 310S2 may be formed. For example, the first contact hole CTH1 extending through the second stack 310S2 between the first supports 320 may be formed. The first contact hole CTH1 may be formed at a level corresponding to the upper portions of the first supports 320. The upper portions of the first supports 320 have a relatively small width, and thus, at the upper portions of the first supports 320, a distance between the first supports 320 may be great and a space for forming the first contact hole CTH1 may be sufficient.

A second contact hole CTH2 extending through the second stack 310S2 and the first stack 310S1 may be formed. For example, the second contact hole CTH2 extending through the second stack 310S2 and the first stack 310S1 between the second supports 330 may be formed. When the first contact hole CTH1 is formed, the second contact hole CTH2 may be formed. However, the embodiments of the present disclosure are not limited thereto, and it is also possible to form the second contact hole CTH2 after forming the first contact hole CTH1. The first contact hole CTH1 and the second contact hole CTH2 may have different heights. For example, the second contact hole CTH2 may be higher than the first contact hole CTH1.

Subsequently, an insulating liner 360 may be formed in the first contact hole CTH1 and the second contact hole CTH2. The insulating liner 360 may be conformally formed in the first contact hole CTH1 and the second contact hole CTH2. The insulating liner 360 may include an insulating material such as an oxide.

Subsequently, a first contact sacrificial layer 340S may be formed in the first contact hole CTH1. A second contact sacrificial layer 350S may be formed in the second contact hole CTH2. When the first contact sacrificial layer 340S is formed, the second contact sacrificial layer 350S may be formed. The first and second contact sacrificial layers 340S and 350S may be formed at the same time. The contact sacrificial layers 340S and 350S may each include a sacrificial material such as tungsten.

Figure 3D:
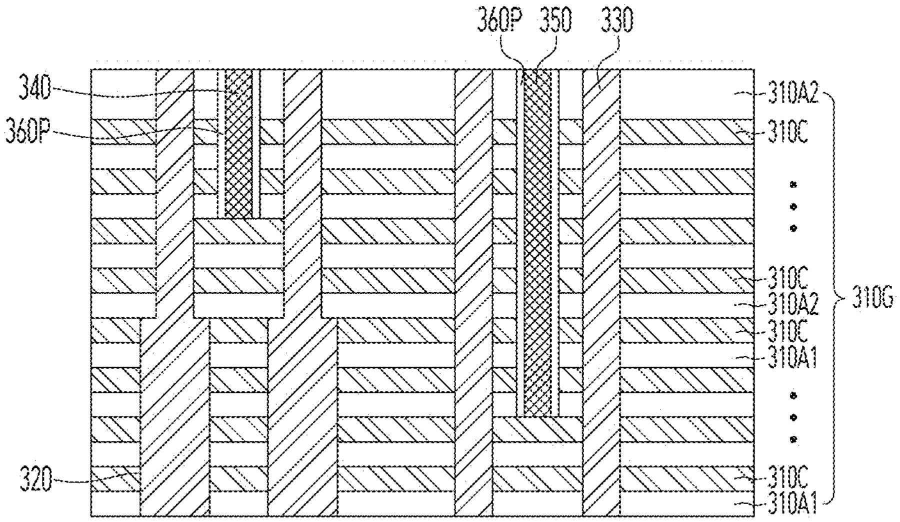

Referring to FIG. 3D, a gate structure 310G may be formed. First, the second material layers 310B1 and the fourth material layers 310B2 of the stacks 310S1 and 310S2 may be removed through a slit (not illustrated). Subsequently, fifth material layers 310C may be formed in regions where the second material layers 310B1 and the fourth material layers 310B2 are removed through the slit. Consequently, the gate structure 310G in which the first material layers 310A1 and the fifth material layers 310C are alternately stacked and the third material layers 310A2 and the fifth material layers 310C are alternately stacked may be formed. In the illustrated embodiment, for example, the fifth material layers 310C may each include a conductive material such as tungsten. For reference, when the second and the fourth material layers 310B1 and 310B2 each includes a conductive material, a process of forming the fifth material layers 310C may be omitted.

In a process of removing the material layers 310B1 and 310B2 of the stacks 310S1 and 310S2 in order to form the gate structure 310G, the stacks 310S1 and 310S2 may be bent. The supports 320 and 330 may support the stacks 310S1 and 310S2 in a process of forming the gate structure 310G, and may prevent or reduce the bending of the stacks 310S1 and 310S2. The supporting force of the supports 320 and 330 may be related to distances between the supports 320 and 330. For example, as the distance between the first supports 320 decreases, the supporting force of the first supports 320 may increase, and as the distance between the first supports 320 increases, the supporting force of the first supports 320 may decrease. Accordingly, the first supports 320 have the greater width at the lower portions thereof than at the upper portions thereof, and thus, at the lower portions of the first supports 320, a distance between the first supports 320 may be smaller and the supporting force may be greater.

In addition, when the first contact sacrificial layer 340S is formed between the first supports 320, the second stack 310S2 may be supported by the first supports 320 and the first contact sacrificial layer 340S. When the second contact sacrificial layer 350S is formed between the second supports 330, the first stack 310S1 and the second stack 310S2 may be supported by the second supports 330 and the second contact sacrificial layer 350S.

Subsequently, the first contact hole CTH1 may be reopened by removing the first contact sacrificial layer 340S. The second contact hole CTH2 may be reopened by removing the second contact sacrificial layer 350S. When the first contact sacrificial layer 340S is removed, the second contact sacrificial layer 350S may be removed.

Subsequently, at least one of the fifth material layers 310C may be exposed through the contact holes CTH1 and CTH2 by etching the insulating liner 360 formed on the bottom surfaces of the first contact hole CTH1 and the second contact hole CTH2. In the illustrated embodiment, for example, the insulating liner 360 may remain on sidewalls of the contact holes CTH1 and CTH2 as insulating spacers 360P.

Subsequently, a first contact structure 340 may be formed in the first contact hole CTH1. When the first contact structure 340 is formed, a second contact structure 350 may be formed in the second contact hole CTH2. In the illustrated embodiment, for example, the contact structures 340 and 350 may be electrically connected to at least one of the fifth material layers 310C of the gate structure 310G. The contact structures 340 and 350 may each include a conductive material such as tungsten.

According to the manufacturing method described above, the third support holes SH3 having a relatively small width may be formed on the first support holes SH1 having a relatively great width. In such a case, the landing margin may be secured in the process of forming the third support holes SH3.

In addition, the first supports 320 having the greater width at the lower portions thereof than at the upper portions thereof may be formed. In such a case, it is possible to secure a space where the first contact structure 340 is to be formed and simultaneously, support the stacks 310S1 and 310S2 in the process of forming the gate structure 310G.

Figure 4A:
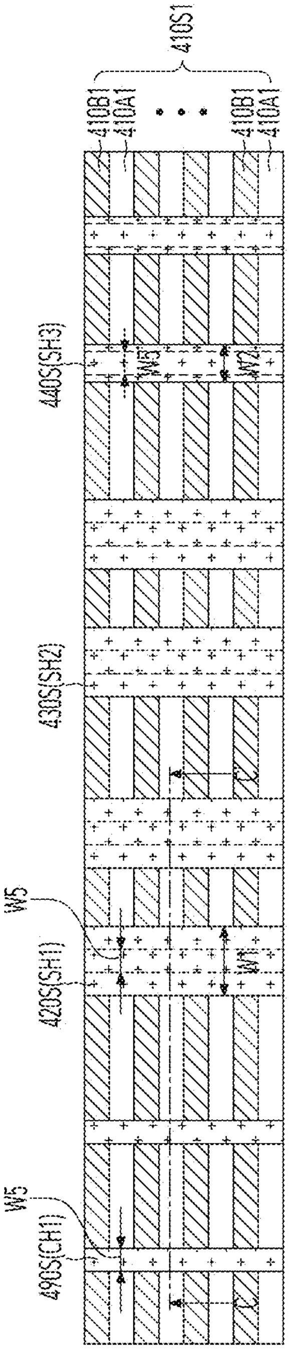
FIGS. 4A, 5A, and 6A, FIGS. 4B, 5B, and 6B, and FIG. 6C are diagrams illustrating a manufacturing method of a semiconductor device in accordance with an embodiment of the present disclosure.
Figure 4B:
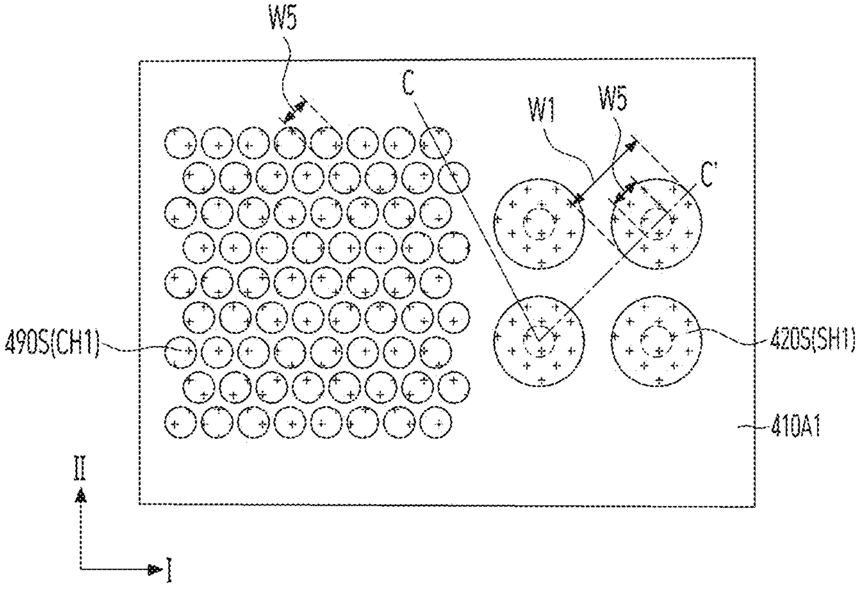
Figure 5A:
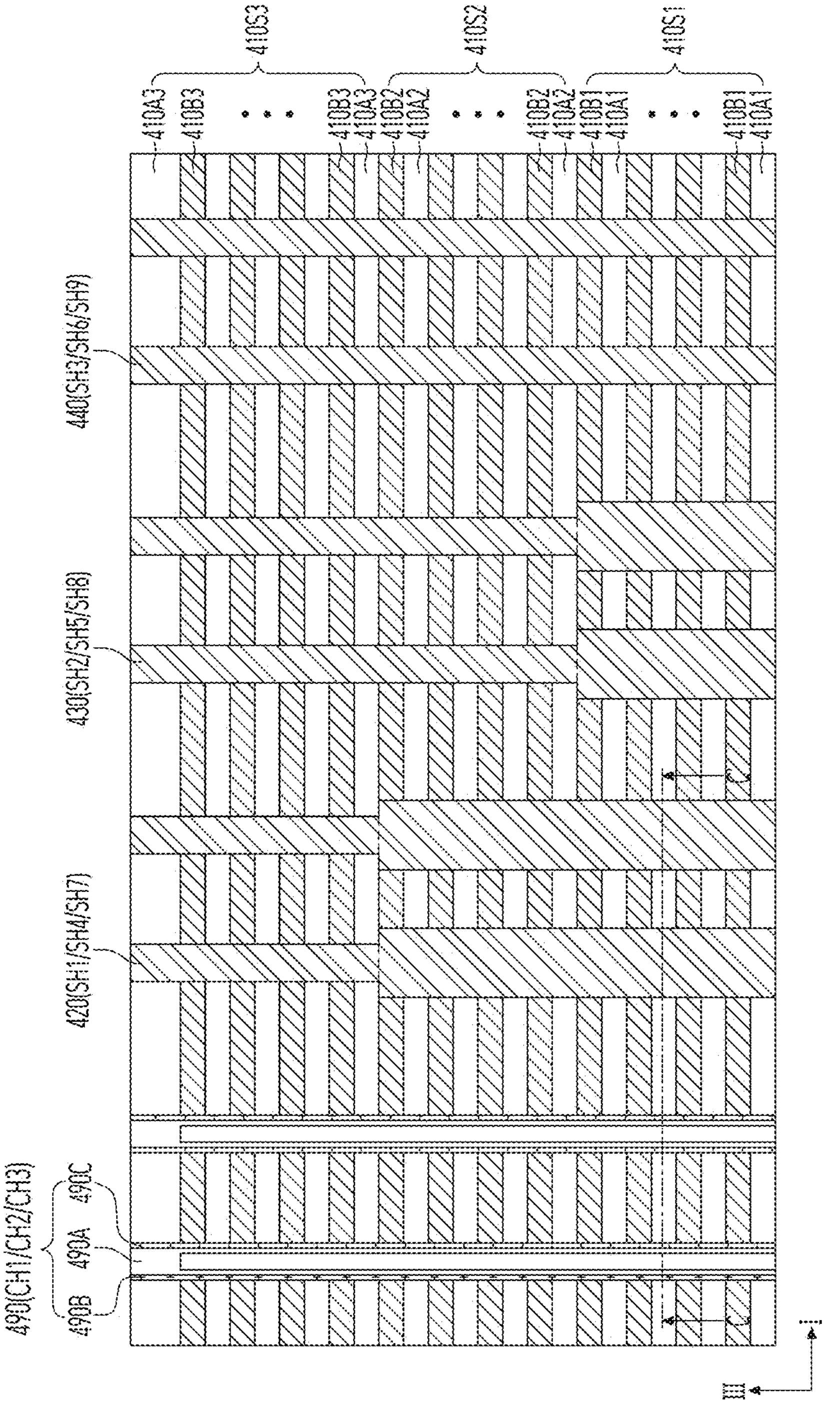
Figure 5B:
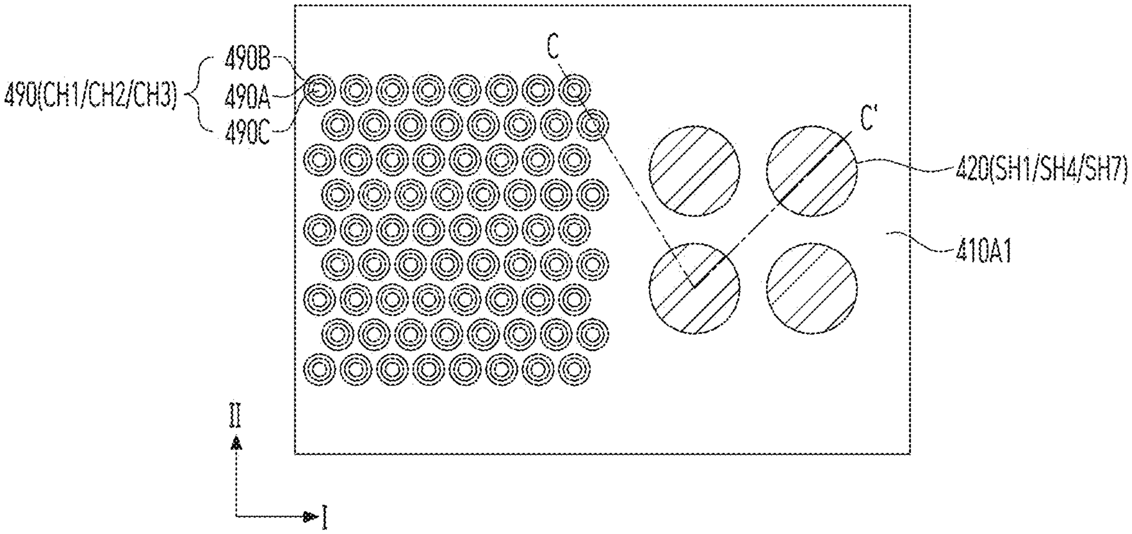
Figure 6A:
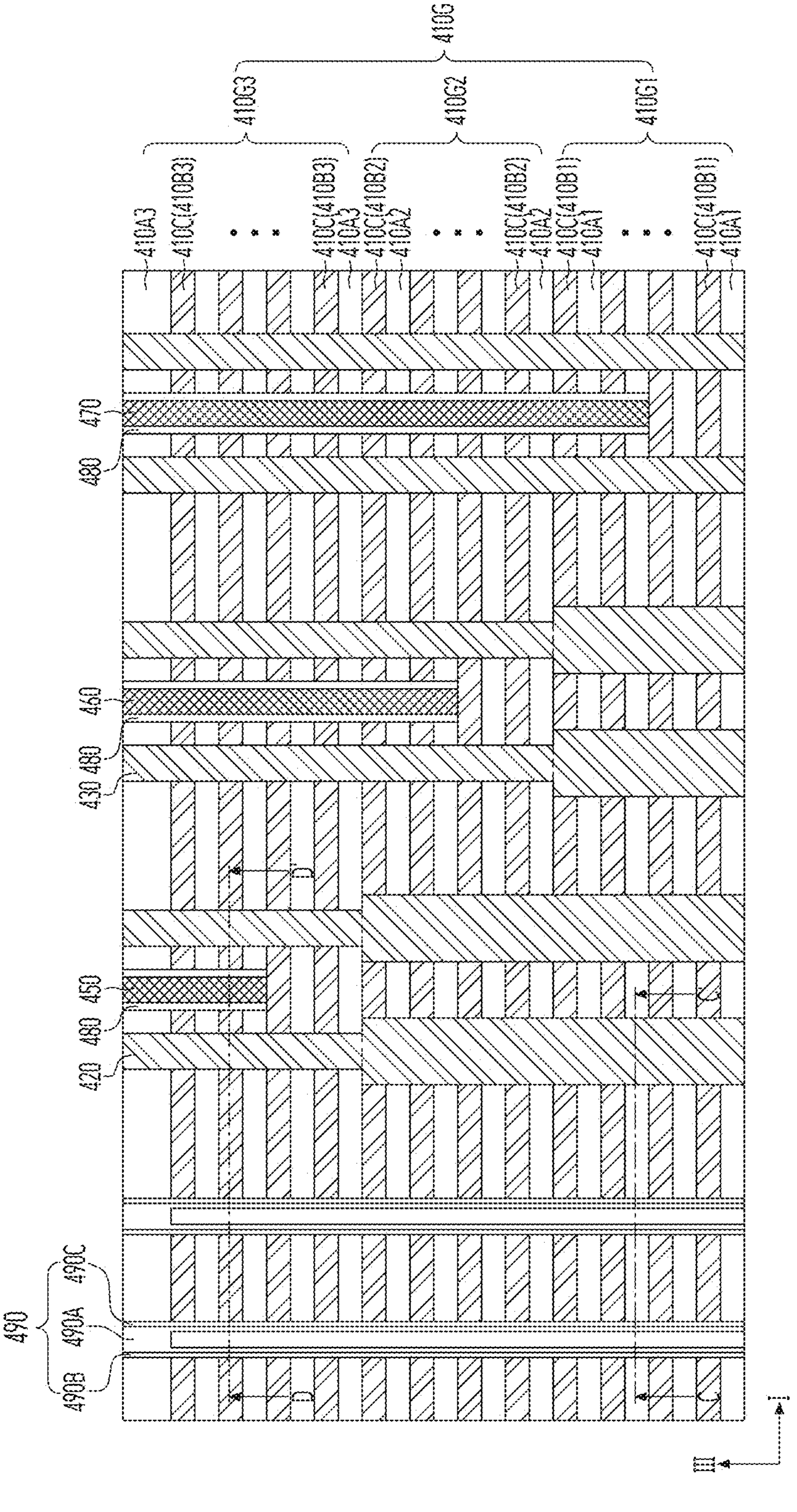
Figure 6B:
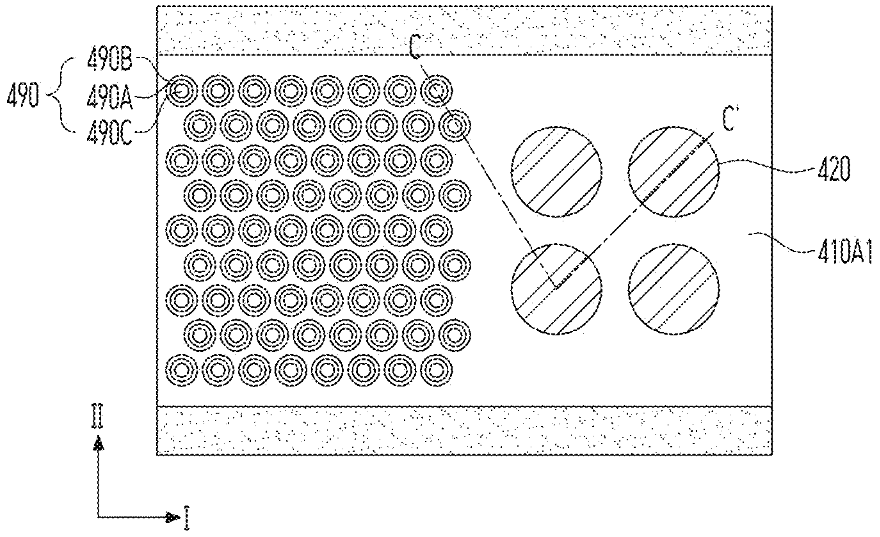
Figure 6C:
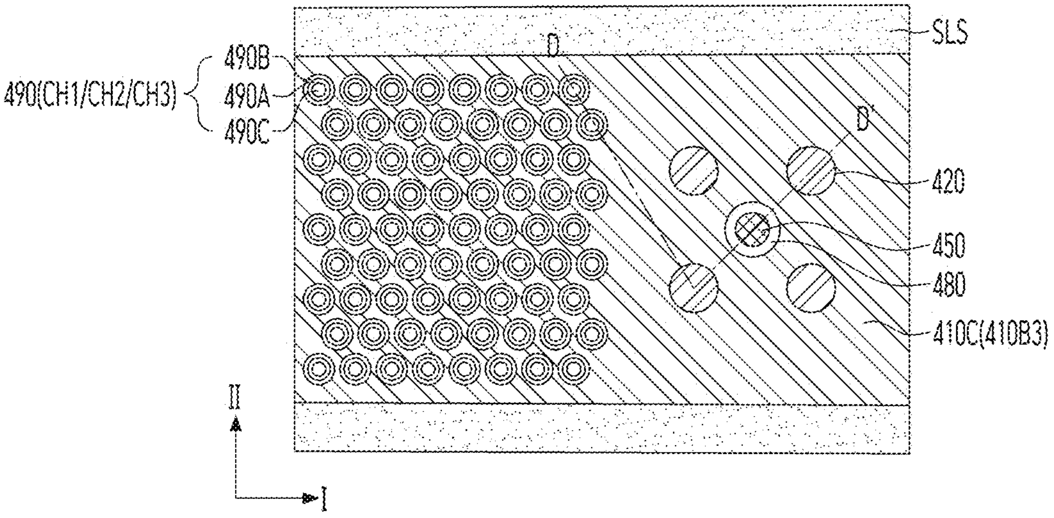

FIGS. 4A, 5A, and 6A, FIGS. 4B, 5B, and 6B, and FIG. 6C are diagrams illustrating a manufacturing method of a semiconductor device in accordance with an embodiment of the present disclosure. FIGS. 4A, 5A and 6A are cross-sectional views, FIG. 4B is a plan view including a plan view taken along line C-C' of FIG. 4A, FIG. 5B is a plan view including a plan view taken along line C-C' of FIG. 5A, FIG. 6B is a plan view including a plan view taken along line C-C' of FIG. 6A, and FIG. 6C is a plan view including a plan view taken along line D-D' of FIG. 6A. Hereinafter, content overlapping with the previously described content may be omitted.

Referring to FIGS. 4A and 4B, a first stack 410S1 may be formed by alternately stacking first material layers 410A1 and second material layers 410B1. In the illustrated embodiment, for example, the first material layers 410A1 may each include an insulating material such as an oxide, and the second material layers 410B1 may each include a sacrificial material such as a nitride. Alternatively, the second material layers 410B1 may each include a conductive material such as tungsten.

Subsequently, first channel holes CH1 extending through the first stack 410S1 may be formed. The first channel holes CH1 may have a fifth width W5. First, second, and third support holes SH1, SH2, and SH3 extending through the first stack 410S1 may be formed. When the first channel holes CH1 are formed, the first, second, and third support holes SH1, SH2, and SH3 may be formed.

The first, second, and third support holes SH1, SH2, and SH3 may be formed to have substantially the same width as the first channel holes CH1. For example, the first support holes SH1, second support holes SH2, and third support holes SH3 may have a fifth width W5.

Subsequently, the first, second, and third support holes SH1, SH2, and SH3 may be selectively expanded to have a width greater than the fifth width W5. For example, the first support holes SH1 and the second support holes SH2 may be expanded to have a first width W1. In the illustrated embodiment, for example, the first width W1 may be greater than the fifth width W5. In addition, the third support holes SH3 may be expanded to have a second width W2. In the illustrated embodiment, for example, the second width W2 may be greater than the fifth width W5.

Various methods for expanding the support holes SH1, SH2, and SH3 may be employed. For example, by selectively exposing the support holes SH1, SH2, and SH3 using a mask pattern, only some support holes may be selectively expanded. By repeatedly performing a process of forming a mask pattern and selectively expanding exposed holes, support holes having various widths may be formed. However, the embodiments of the present disclosure are not limited thereto. For example, in an embodiment, holes having different widths may be formed simultaneously by etching a stack using a mask pattern including holes having different widths.

Subsequently, a sacrificial material may be formed in the first channel holes CH1, and the first, second, and third support holes SH1, SH2, and SH3. Accordingly, first channel sacrificial layers 490S may be formed in the first channel holes CH1, first support sacrificial layers 420S may be formed in the first support holes SH1, second support sacrificial layers 430S may be formed in the second support holes SH2, and third support sacrificial layers 440S may be formed in the third support holes SH3. In the illustrated embodiment, for example, the sacrificial material may include tungsten, carbon, metal nitride, or the like.

Referring to FIGS. 5A and 5B, a second stack 410S2 may be formed over or on the first stack 410S1 In the illustrated embodiment, for example, the second stack 410S2 may include third material layers 410A2 and fourth material layers 410B2 that are alternately stacked. The third material layers 410A2 may include substantially the same material as the first material layers 410A1, and the fourth material layers 410B2 may include substantially the same material as the second material layers 410B1.

Subsequently, second channel holes CH2, fourth support holes SH4, fifth support holes SH5, and sixth support holes SH6 extending through the second stack 410S2 may be formed. The second channel holes CH2 may expose the first channel sacrificial layers 490S. The fourth support holes SH4 may expose the first support sacrificial layers 420S. The fifth support holes SH5 may expose the second support sacrificial layers 430S. The sixth support holes SH6 may expose the third support sacrificial layers 440S.

When the second channel holes CH2 are formed, the fourth support holes SH4, the fifth support holes SH5, and the sixth support holes SH6 may be formed. Widths of the support holes SH4, SH5, and SH6 may be greater than a width of the second channel holes CH2. For example, after the second channel holes CH2 and the support holes SH4, SH5, and SH6 are formed to have the same width, the support holes SH4, SH5, and SH6 may be selectively expanded. However, the embodiments of the present disclosure are not limited thereto, and it is also possible to form the support holes SH4, SH5, and SH5 having different widths from the second channel holes CH2 using a mask pattern having different widths. In the illustrated embodiment, for example, the fourth support holes SH4 may have a first width W1, and the fifth support holes SH5 and the sixth support holes SH6 may each have a second width W2.

Subsequently, a sacrificial material may be formed in the holes CH2, SH4, SH5, and SH6. For example, second channel sacrificial layers (not illustrated) may be formed in the second channel holes CH2. Fourth support sacrificial layers (not illustrated) may be formed in the fourth support holes SH4. Fifth support sacrificial layers (not illustrated) may be formed in the fifth support holes SH5. Sixth support sacrificial layers (not illustrated) may be formed in the sixth support holes SH6.

Subsequently, a third stack 410S3 may be formed by alternately stacking fifth material layers 410A3 and sixth material layers 410B3 on the second stack 410S2. The fifth material layers 410A3 may include substantially the same material as the first material layers 410A1 and the third material layers 410A2, and the sixth material layers 410B3 may include substantially the same material as the second material layers 410B1 and the fourth material layers 410B2.

Subsequently, third channel holes CH3, seventh support holes SH7, eighth support holes SH8, and ninth support holes SH9 extending through the third stack 410S3 may be formed. The third channel holes CH3 may expose the second channel sacrificial layers. The seventh support holes SH7 may expose the fourth support sacrificial layers. The eighth support holes SH8 may expose the fifth support sacrificial layers. The ninth support holes SH9 may expose the sixth support sacrificial layers.

The second channel sacrificial layers and the first channel sacrificial layers 490S may be removed through the third channel holes CH3. Subsequently, channel structures 490 may be formed in the channel holes CH1, CH2, and CH3. In the illustrated embodiment, for example, the channel structure 490 may include at least one of a channel layer 490A, a memory layer 490B surrounding the channel layer 490A, and an insulating core 490C located in the channel layer 490A.

The fourth support sacrificial layers and the first support sacrificial layers 420S may be removed through the seventh support holes SH7. Subsequently, first supports 420 may be formed in the support holes SH1, SH4, and SH7. The fifth support sacrificial layers and the second support sacrificial layers 430S may be removed through the eighth support holes SH8. Subsequently, second supports 430 may be formed in the support holes SH2, SH5, and SH8. The sixth support sacrificial layers and the third support sacrificial layers 440S may be removed through the ninth support holes SH9. Subsequently, third supports 440 may be formed in the support holes SH3, SH6, and SH9.

Referring to FIGS. 6A to 6C, a gate structure 410G including gate structures 410G1, 410G2 and 410G3 may be formed. For example, slits SL extending through the stacks 410S1, 410S2, and 410S3 may be formed. Subsequently, the second material layers 410B1, the fourth material layers 410B2, and the sixth material layers 410B3 may be removed through the slits SL. Subsequently, seventh material layers 410C may be formed in regions where the material layers 410B1, 410B2, and 410B3 are removed. In the illustrated embodiment, for example, the seventh material layers 410C may each include a conductive material such as tungsten. Consequently, the gate structure 410G in which the material layers 410A1, 410A2, and 410A3 and the seventh material layers 410C are alternately stacked may be formed. Here, the first gate structure 410G1 may include the first material layers 410A1 and the seventh material layers 410C which are alternately stacked, the second gate structure 410G2 may include the third material layers 410A2 and the seventh material layers 410C which are alternately stacked, the third gate structure 410G3 may include the fifth material layers 410A3 and the seventh material layers 410C which are alternately stacked. For reference, when the material layers 410B1, 410B2, and 410B3 each include a conductive material, a process of forming the seventh material layers 410C may be omitted. Subsequently, slit structures SLS may be formed in the slits SL. The slit structures SLS may each include at least one of a conductive material, an insulating material, and a semiconductor material.

Contact structures 450, 460, and 470 extending through the gate structure 410G may be formed. Insulating spacers 480 may be disposed over sidewalls of the contact structures 450, 460, and 470. A first contact structure 450 may be formed between the first supports 420. A second contact structure 460 may be formed between the second supports 430. A third contact structure 470 may be formed between the third supports 440. The contact structures 450, 460, and 470 may have different heights. The contact structures 450, 460, and 470 may be electrically connected to at least one of the seventh material layers 410C of the gate structure 410G.

According to the manufacturing method described above, after the channel holes CH1, CH2, and CH3 and the support holes SH1, SH2, SH3, SH4, SH5, SH6, SH7, SH8, and SH9 having substantially the same width are formed, the support holes SH1, SH2, SH3, SH4, SH5, SH6, SH7, SH8, and SH9 may be expanded to have desired widths. Accordingly, the support holes SH1, SH2, SH3, SH4, SH5, SH6, SH7, SH8, and SH9 having different widths may be formed.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A semiconductor device comprising:

a first gate structure including first insulating layers and first conductive layers alternately stacked;

a second gate structure disposed over or on the first gate structure and including second insulating layers and second conductive layers alternately stacked;

first supports, each first support including a first portion extending through the first gate structure and having a first width and a second portion extending through the second gate structure and having a second width, the first width being greater than the second width;

second supports extending through the first gate structure and the second gate structure and having a third width;

a first contact structure extending through the second gate structure between the first supports, the first contact structure being electrically connected to at least one of the second conductive layers; and a second contact structure extending through the second gate structure and the first gate structure between the second supports, the second contact structure being electrically connected to at least one of the first conductive layers.

2. The semiconductor device of claim 1, wherein the first portions of the first supports are spaced apart from each other by a first distance, the second portions of the first supports are spaced apart from each other by a second distance, and the first distance is smaller than the second distance.

3. The semiconductor device of claim 2, wherein the second supports are spaced apart from each other by a third distance, and the first distance is smaller than the third distance.

4. The semiconductor device of claim 1, wherein the first width is greater than the third width.

5. The semiconductor device of claim 1, wherein the first contact structure has a first height, and the second contact structure has a second height greater than the first height.

6. The semiconductor device of claim 1, further comprising channel structures extending through the first gate structure and the second gate structure.

7. The semiconductor device of claim 6, wherein each of the channel structures has a fourth width, and the fourth width is smaller than the second width or the third width.

8. The semiconductor device of claim 1, wherein the first supports or the second supports are arranged in a first direction or a second direction intersecting the first direction.

9. The semiconductor device of claim 1, wherein the first supports or the second supports each include oxide.

* * * * *